(12) United States Patent
Drum

(10) Patent No.: US 6,611,729 B1
(45) Date of Patent: Aug. 26, 2003

(54) SYSTEM AND METHOD FOR INTRODUCING MULTIPLE COMPONENT-TYPE FACTORS INTO AN INTEGRATED CIRCUIT YIELD PREDICTION

(75) Inventor: Charles M. Drum, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/520,670

(22) Filed: Mar. 7, 2000

(51) Int. Cl.[7] .............................................. G06F 19/00
(52) U.S. Cl. ...................................... 700/110; 700/121
(58) Field of Search ........................ 700/97, 108, 121, 700/110, 109; 703/13, 14; 716/4, 8; 438/14

(56) References Cited

U.S. PATENT DOCUMENTS

| 5,128,737 | A | * | 7/1992 | van der Have | 257/503 |
|---|---|---|---|---|---|
| 5,487,039 | A | * | 1/1996 | Sukegawa | 365/200 |
| 5,539,652 | A | * | 7/1996 | Tegethoff | 700/108 |
| 5,539,752 | A | * | 7/1996 | Berezin et al. | 702/35 |
| 5,773,315 | A | * | 6/1998 | Jarvis | 438/14 |
| 6,214,630 | B1 | * | 4/2001 | Hsuan et al. | 324/765 |
| 6,284,553 | B1 | * | 9/2001 | Steffan et al. | 438/14 |

OTHER PUBLICATIONS

William Stallings, "Computer Organization and Architecture," MacMillan Publishing Company, USA, (3rd ed. 1993).

* cited by examiner

*Primary Examiner*—Leo Picard
*Assistant Examiner*—Kidest Bahta

(57) ABSTRACT

A system for, and method of, introducing multiple component-type factors into a yield prediction regarding a wafer. In one embodiment, the system includes: (1) a first routine that accepts a first factor representing a probability of a first component-type area of an integrated circuit on the wafer being functional and (2) a second routine, associated with the first routine, that accepts a second factor representing a probability of a second component-type area of the integrated circuit being functional.

23 Claims, 3 Drawing Sheets

SYSTEM AND METHOD FOR INTRODUCING MULTIPLE COMPONENT-TYPE FACTORS INTO AN INTEGRATED CIRCUIT YIELD PREDICTION

TECHNICAL FIELD OF THE INVENTION

The present invention is directed, in general, to yield prediction and, more specifically, to a system and method for introducing multiple component-type factors into an integrated circuit yield prediction.

BACKGROUND OF THE INVENTION

In the realm of semiconductor fabrication, the ability to predict the yield of a semiconductor wafer with respect to the number of integrated circuit chips that will function within their design specifications is of paramount importance. This capability impacts an organization's planning, marketing, design, process development, product engineering, manufacturing and management functions to a great degree. This range of organizational impact motivates semiconductor fabricators to develop tools that may be used to predict the yields of semiconductor wafers. Some of these tools are models, which have their origin in quality assurance programs.

Quality assurance programs that focus on producing a high percentage of acceptable semiconductor devices typically require constant checking for defects. Thus, semiconductor manufacturers have attempted to integrate frequent quality control checks into the fabrication process wherein this process of checking is typically performed in all stages of production. Many types of defects may arise from process contaminants during the manufacturing process. These defects may be classified either as "fatal" or non-critical. Fatal defects are capable of causing a malfunction or failure in the semiconductor device. Non-critical defects do not substantially affect the performance of the semiconductor device.

Fatal defects are highly undesirable, because they often require that the defective semiconductor device be destroyed and another be manufactured in its place, thereby increasing the overall cost of manufacturing the final device. If there are a high number of fatal defects causing the number of functional dies on the semiconductor wafer to be low, it may not be economically viable to further process the wafer into packaged chips. However, non-critical defects typically cause few problems and are therefore of limited concern when fabricating semiconductor devices.

Yield models may be used to predict the number of dies on a semiconductor wafer that will meet their design specifications. Different integrated circuit architectures usually provide different defect densities. This may occur due to either a complexity of the circuit components, the extent of die real estate needed to construct the circuit or factors involving both of these. The capability of current yield models to accurately predict wafer yield is limited when a particular die contains a collection of different circuit architectures. This limitation reduces the value of many current yield prediction estimating techniques.

Accordingly, what is needed in the art is an improved way to incorporate diverse defect characteristics of different circuit architectures in estimating semiconductor wafer yields.

SUMMARY OF THE INVENTION

To address the above-discussed deficiencies of the prior art, the present invention provides a system for, and method of, introducing multiple component-type factors into a yield prediction regarding a wafer. In one embodiment, the system includes: (1) a first routine that accepts a first factor representing a probability of a first component-type area of an integrated circuit on the wafer being functional and (2) a second routine, associated with the first routine, that accepts a second factor representing a probability of a second component-type area of the integrated circuit being functional.

The present invention therefore introduces the broad concept of taking multiple component-types into account before undergoing a yield prediction with respect to a wafer. The resulting yield prediction becomes substantially more accurate, allowing costs and prices of future integrated circuits to be predicted more precisely. "Component-type" is defined as an architecturally similar portion of circuitry, often, but not always, corresponding to a particular function to be carried out. In examples that follow, component-types include "memory" (such as static random access memory (SRAM) and dynamic access memory (DRAM)), so-called "logic" or "standard circuitry" (the circuitry, such as data processing circuitry, that typically cooperates with memory in a particular class of integrated circuit) and "null circuitry" (blank spaces on a wafer that do not contain active circuitry).

In one embodiment of the present invention, the first factor is based on a defect density of a first component-type and a size of the first component-type area. In a related embodiment, the second factor is based on a defect density of a second component-type and a size of the second component-type area.

In one embodiment of the present invention, the first factor is exponentially related to a defect density of a first component-type. In a related embodiment, the second factor is exponentially related to a defect density of a second component-type.

In one embodiment of the present invention, the first component-type is selected from the group consisting of: (1) a standard component, (2) a memory component and (3) a null component. The present invention is not limited to these particular component-types.

In one embodiment of the present invention, the probability is determined by employing a function selected from the group consisting of: (1) a Poisson function, (2) a Murphy function and (3) a negative binomial function. Those skilled in the pertinent art will understand, however, that other conventional or later-discovered probability functions are within the broad scope of the present invention.

In one embodiment of the present invention, the system further includes a third routine, associated with the first and second routines, that performs the yield prediction employing results of the first and second routines. The present invention is not limited to employing results of the first and second routines.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
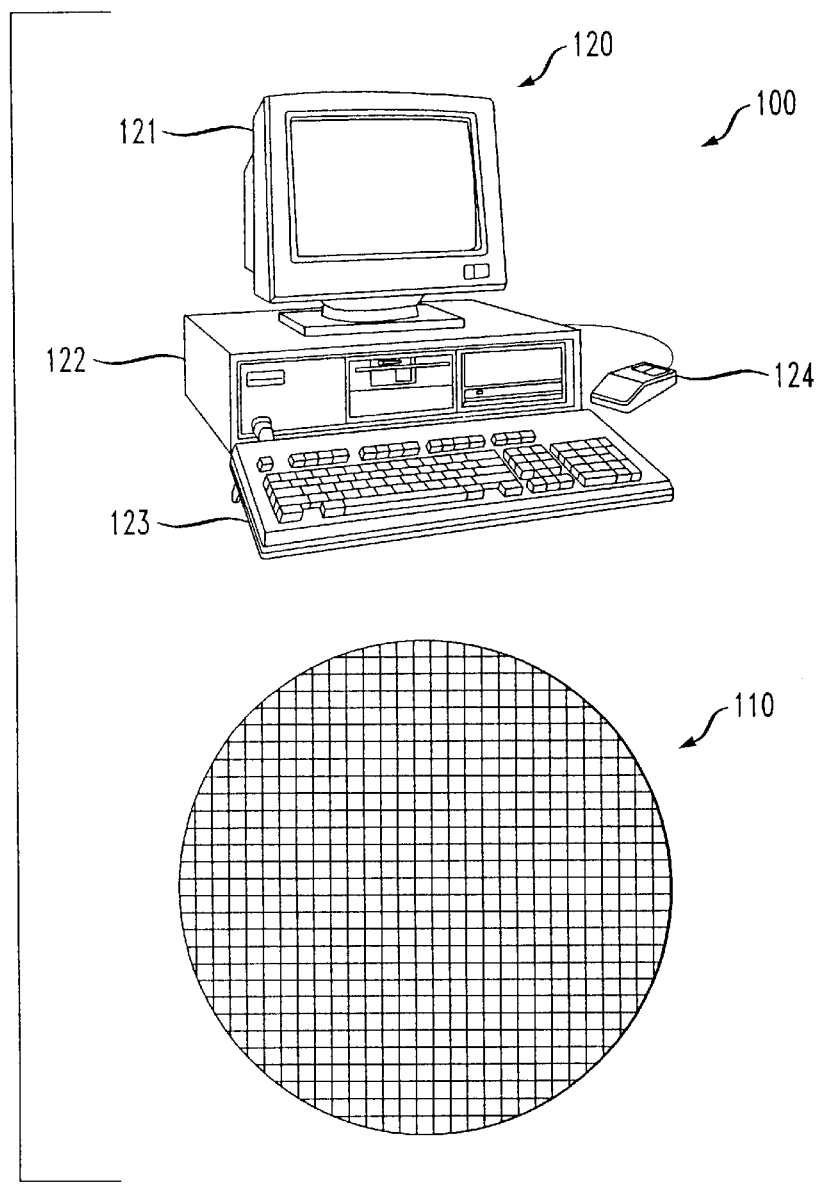
FIG. 1 illustrates a diagram showing an embodiment of a system for introducing multiple component-type factors into a yield prediction.

Referring initially to FIG. 1, illustrated is a diagram showing an embodiment of a system for introducing multiple component-type factors into a yield prediction, generally designated 100. The system 100 includes a semiconductor wafer 110 and a general purpose computer 120. The semiconductor wafer 110 is typically used in the manufacture of integrated circuits and includes a multiplicity of potential sites for their construction. Each of the potential sites is shown as a small rectangle on the semiconductor wafer 110 and may contain an individual integrated circuit. A site containing an integrated circuit may be generally referred to as a die wherein the die is separated from the semiconductor wafer 110 to form an integrated circuit chip. The chip is then encapsulated in a package for use.

A die may comprise multiple component-types. For example, a die may have a memory component(such as static random access memory (SRAM)), a standard or logic component(such as digital processing units) and a null component (blank spaces on a wafer that do not contain active circuitry).

Testing of a die encompasses determination of whether the integrated circuit contained in the die is "functional." Then further determination is required as to whether a functional die contains an integrated circuit that is "good", meaning that it operates within required specifications. This also includes testing each component-type of the integrated circuit.

The present invention therefore introduces the broad concept of taking multiple component-types into account before designing and manufacturing the semiconductor wafer 110. One component-type typically has a different yield factor another component-type. For example, a component-type such as SRAM has a different yield factor than a standard component such as an analog signal processing unit. Null components which do not contain active circuitry, such as blank areas on the die, are taken to have yield factors or probabilities equal to unity. Background information on different defect densities for different component-types is more fully discussed in *The Competitive Semiconductor Manufacturing Survey: Third Report On Results of the Main Phase*, by Robert C. Leachman, Report CSM-31, The Competitive Semiconductor Manufacturing Program Engineering Systems Research Center (Aug. 15, 1996) and incorporated herein by reference.

Since one component-type typically has a different yield factor than another component-type, accounting for each of the multiple component-types increases the accuracy of the yield prediction. As a result of these more accurate yield predictions, manufacturers can predict more precisely the costs and prices of future integrated circuits.

The semiconductor wafer 110 may also contain flaws itself that are not related to a component-type or a particular die. A large low-yield area in the center of the semiconductor wafer 110, or a large low-yield ring around its edge are examples of such flaws. In one embodiment, the present invention incorporates these flaws as a wafer factor YZERO. The wafer factor YZERO may be defined as a gross yield or a fractional functional yield for dies approaching zero die area. The wafer factor YZERO is a dimensionless quantity having a value between zero and one. A value of at least 0.9 is an acceptable range for the wafer factor YZERO indicating that only 10 percent of the wafer sites are not capable of providing functional dies.

The general purpose computer 120 may be used in this embodiment to gather at least some of the testing information and to conduct the yield prediction. Of course, other systems or equipment may be so used and are within the scope of the present invention. The general purpose computer 120 includes a monitor 121, a chassis 122, a keyboard 123 and a pointing device 124. Alternatively, however, the monitor 121, the keyboard 123 and the pointing device 124 may be replaced by other conventional output and input devices, respectively.

It should be noted that any conventional computer system having at least one CPU that is suitable to function as the general purpose computer 120 may replace, or be used in conjunction with, the general purpose computer 120. Included without limitation are hand-held units, laptop/notebooks, minicomputers, mainframe computers and supercomputers, including RISC and parallel processing architectures, as well as computer system network combinations. Conventional computer system architecture is more fully discussed in *Computer Organization and Architecture*, by William Stallings, MacMillan Publishing Co. (3rd ed. 1993) and incorporated herein by reference. Alternative computer system embodiments may be firmware-or hardware-based.

Figure 2:
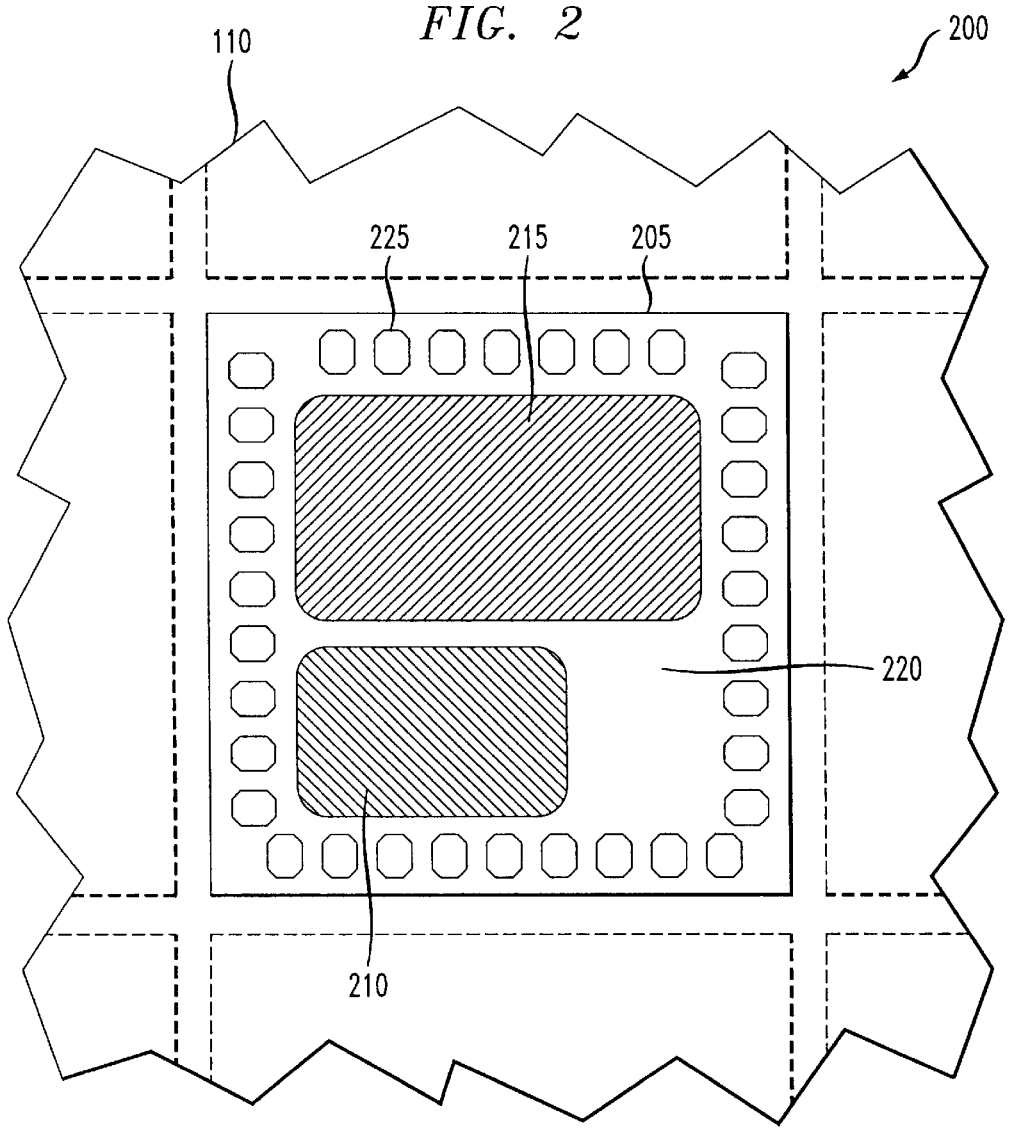
FIG. 2 illustrates an enlarged portion of the semiconductor wafer of FIG. 1 showing a die.

Turning now to FIG. 2, illustrated is an enlarged portion of the semiconductor wafer 110 of FIG. 1 showing an example of a die 205. In the illustrated embodiment, the die 205 includes a standard components region 210, a memory components region 215, a null components region 220 and a collection of contact terminals 225. The present invention is not limited to these particular component-types, however, and they are shown as examples of component-types in the illustrated embodiment. Additionally, the number of component-types are not limited to those shown but may include any appropriate number.

For simplicity, the following discussion will combine the standard components region 210 and the and the collection of contact terminals 225 as the standard components region. The standard components region 210 has a standard components defect density SCDZERO associated with its particular component-type, and the memory components region 215 has a memory components defect density MCDZERO associated with its particular component-type. The null components region 220 typically has a defect density of zero since it contain no active circuitry. The standard components region 210 has a standard components area SCDAREA, and the memory components region 215 has a memory components area MCDAREA. The null components region 220 has a null components area NCDAREA. The total die area is the sum of SCDAREA, MCDAREA and NCDAREA.

A component-type defect density, such as those stated above, may be defined qualitatively as the density of small fatal defects associated with the particular component-type and die area. A fatal defect is one that prohibits a circuit from functioning and is expressed as the number of total defects per area (eg., square centimeter). The component-type defect density causes a yield percentage to decrease as the component-type die area increases, since a larger percentage of the die will contain at least one fatal defect. Of course, for very small component-type die area the reverse is true, and the yield percentage will tend to increase.

Figure 3:
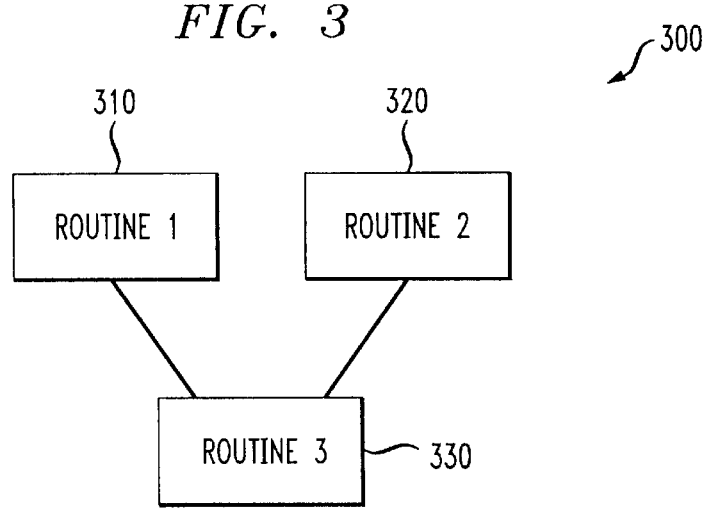
FIG. 3 illustrates a block diagram of a system for performing a yield prediction with respect to the semiconductor wafer of FIG. 1 containing integrated circuits having multiple component-types.

Turning now to FIG. 3, illustrated is a block diagram of a system, generally designated 300, for performing a yield prediction with respect to the proposed semiconductor wafer 110 of FIG. 1 containing integrated circuits having multiple component-types. The system 300 includes a first routine 310, a second routine 320 and a third routine 330. In the illustrated embodiment, the first routine 310 accepts a first factor PROBSTD, which represents a probability of a first component-type area being functional, shown as the standard components region 210 in FIG. 2 on the semiconductor wafer 110. The second routine 320, associated with the first routine 310, accepts a second factor PROBMEM representing a probability of a second component-type area being functional, shown as the memory components region 215 of FIG. 2.

Additionally, the system 300 further includes a third routine 330, associated with the first and second routines 310, 320, that employs the results of the first and second routines 310, 320 in a total yield function to perform the yield prediction. In the illustrated embodiment, the third routine 330 also incorporates a third factor PROBNULL which represents the probability of a null component-type area. In this case, the value of PROBNULL is taken to be unity.

In the illustrated embodiment, the first factor PROBSTD employs the SCDZERO and the SCDAREA which are associated with the standard components region 210 of FIG. 2. The second factor PROBMEM employs the MCDZERO and the MCDAREA which are associated with the memory components region 215 of FIG. 2. In one embodiment, the first factor PROBSTD and the second factor PROBMEM may be represented, using the Poisson function, respectively as:

$$PROBSTD=\exp(-SCDZERO*SCDAREA), \text{ and}$$

$$PROBMEM=\exp(-MCDZERO*MCDAREA).$$

Alternatively, the second factor PROBMEM may use a magnitude factor MMEM associated with the memory components region 215 which is the ratio of the MCDZERO to SCDZERO. The second factor PROBMEM may be represented as:

$$PROBMEM=\exp(-SCDZERO*MCDAREA*MMEM).$$

In an alternate embodiment, the probabilities (such as PROBSTD and PROBMEM) used by the first and second routines 310, 320, are determined by employing a Murphy function or a negative binomial function. Those skilled in the pertinent art will understand, however, that other conventional or later-discovered probability functions are within the broad scope of the present invention.

The first routine 310, employing the first factor PROBSTD, and the second routine 320, employing the second factor PROBMEM, are used by the third routine 330 to perform the yield prediction. In the illustrated embodiment, the third routine 330 employs the first and second factors in a total yield function to perform the yield prediction.

The total yield function depicting a yield for the semiconductor wafer 110 may be expressed as:

$$yield(GCPW)=YZERO*SITES*(G/F)*PROBSTD*PROBMEM,$$

where,

GCPW means good chips per wafer,

YZERO is the wafer factor for the semiconductor wafer 110,

SITES is the number of die sites for the semiconductor wafer 110, and

G/F is the ratio of good to functional dies for the semiconductor wafer 110.

Figure 4:
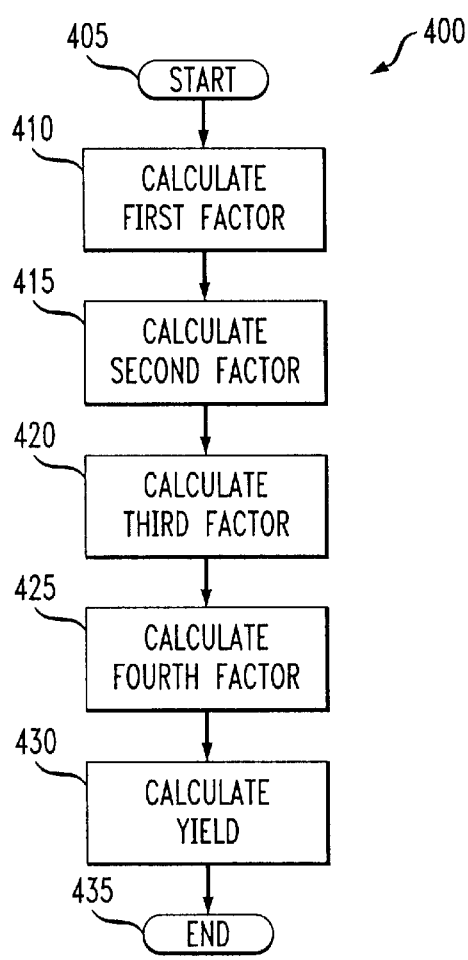
FIG. 4 illustrates a flow diagram of a method of introducing multiple component-type factors into a yield prediction regarding a semiconductor wafer.

Turning now to FIG. 4, illustrated is a flow diagram of one embodiment of a method 400 of introducing multiple component-type factors into a yield prediction regarding a semiconductor wafer. The method 400 starts in a step 405 with the intent to obtain a yield associated with the semiconductor wafer will be described. An example of a semiconductor wafer having three active component-types on each die of the semiconductor wafer. However, the present invention is not limited to only three active component-types on each die or on the semiconductor wafer.

In a step 410, a first factor PROBSTD is calculated for a standard components region. In this example, the standard components region has an SCDZERO of 0.45 total defects per square centimeters (dpsc) and an SCDAREA of 0.317 square centimeters (sc). The PROBSTD may be calculated, using the Poisson function, as:

$$PROBSTD=\exp(-SCDZERO*SCDAREA),$$

$$PROBSTD=\exp(-0.45*0.317), \text{ and}$$

$$PROBSTD=0.867.$$

Then in a step 415, a second factor PROBMEM1 may be calculated for a first memory type MEM1. In this example, MEM1 has a MCDZERO1 of 0.99 dpsc and an MCDAREA1 of 0.403 sc. The PROBMEM1 may be calculated, using the Poisson function, as:

$$PROBMEM1=\exp(-MCDZERO1*MCDAREA1),$$

$$PROBMEM1=\exp(-0.99*0.403), \text{ and}$$

$$PROBMEM1=0.671.$$

In a step 420, a third factor PROBMEM2 may be calculated for a second memory type MEM2. In this example, MEM2 has a MCDZERO2 of 0.81 dpsc and an MCDAREA2 of 0.080 sc. The PROBMEM2 may be calculated, using the Poisson function, as:

$$PROBMEM2=\exp(-MCDZERO2*MCDAREA2),$$

$$PROBMEM2=\exp(-0.81*0.080), \text{ and}$$

$$PROBMEM2=0.937.$$

Then in a step 425, a fourth factor PROBNULL may be calculated for a null components region. In this example, the null components region has a null components defect density NCDZERO of 0 dpsc and an NCDAREA of 0.200 sc. The PROBNULL may be calculated, using the Poisson function, as:

$$PROBNULL=\exp(-NCDZERO*NCDAREA),$$

$$PROBNULL=\exp(-0*0.200), \text{ and}$$

$$PROBNULL=1.$$

Throughout the steps 415, 420 and 425 it may be seen that the defect densities varied to reflect the complexity of a component-type.

In a step 430, a yield for the semiconductor wafer may be calculated using a total yield function. In this example, the wafer factor YZERO is 0.95, the SITES is 236 and the ratio G/F is 0.96. The yield may be calculated as:

$$yield = YZERO*SITES*(G/F)*PROBSTD*PROBMEM1*PROBMEM2*PROBNULL,$$

$$yield = 0.95*236*0.96*0.867*0.671*0.937*1, \text{ and}$$

$$yield = 117 \text{ good chips per wafer.}$$

The method 400 ends in a step 435. This example illustrates how one may predict the total yield in good chips per wafer, prior to design, for a die with the component-types described above. One skilled in the art should know that the present invention is not limited to the values or component-types described above. Also, other embodiments of the present invention may have additional or fewer steps than described above.

Although the present invention has been described in detail, those skilled in the art should understand that they can make various changes, substitutions and alterations herein without departing from the spirit and scope of the invention in its broadest form.

What is claimed is:

1. A system for introducing multiple component-type factors into a yield prediction regarding a wafer, comprising:
    a first routine that accepts a first factor representing a probability of a first component-type area of an integrated circuit on said wafer being functional, said first component-type area including circuitry of a first component-type; and
    a second routine, associated with said first routine, that accepts a second factor representing a probability of a second component-type area of said integrated circuit being functional, said second component-type area including circuitry of a second component-type different from said first component-type.

2. The system as recited in claim 1 wherein said first factor is based on a defect density of a first component-type and a size of said first component-type area.

3. The system as recited in claim 1 wherein said second factor is based on a defect density of a second component-type and a size of said second component-type area.

4. The system as recited in claim 1 wherein said first factor is exponentially related to a defect density of a first component-type.

5. The system as recited in claim 1 wherein said second factor is exponentially related to a defect density of a second component-type.

6. The system as recited in claim 1 wherein said first component-type is selected from the group consisting of:
    a standard component,
    a memory component, and
    a null component.

7. The system as recited in claim 1 wherein said probability is determined by employing a function selected from the group consisting of:
    a Poisson function,
    a Murphy function, and
    a negative binomial function.

8. The system as recited in claim 1 further comprising a third routine, associated with said first and second routines, that performs said yield prediction employing results of said first and second routines.

9. A method of introducing multiple component-type factors into a yield prediction regarding a wafer, comprising:
    accepting a first factor representing a probability of a first component-type area of an integrated circuit on said wafer being functional, said first component-type area including circuitry of a first component-type; and
    accepting a second factor representing a probability of a second component-type area of said integrated circuit being functional, said second component-type area including circuitry of a second component-type different from said first component-type.

10. The method as recited in claim 9 wherein said first factor is based on a defect density of a first component-type and a size of said first component-type area.

11. The method as recited in claim 9 wherein said second factor is based on a defect density of a second component-type and a size of said second component-type area.

12. The method as recited in claim 9 wherein said first factor is exponentially related to a defect density of a first component-type.

13. The method as recited in claim 9 wherein said second factor is exponentially related to a defect density of a second component-type.

14. The method as recited in claim 9 wherein said first component-type is selected from the group consisting of:
    a standard component,
    a memory component, and
    a null component.

15. The method as recited in claim 9 further comprising determining said probability by employing a function selected from the group consisting of:
    a Poisson function,
    a Murphy function, and
    a negative binomial function.

16. The method as recited in claim 9 further comprising performing said yield prediction employing said first and second factors.

17. A system for performing a yield prediction with respect to a wafer containing integrated circuits having multiple component-types, comprising:
    a first routine that accepts a first factor representing a probability of a first component-type area of an integrated circuit on said wafer being functional, said first component-type area including circuitry of a first component-type;
    a second routine that accepts a second factor representing a probability of a second component-type area of said integrated circuit being functional, said second component-type area including circuitry of a second component-type different from said first component-type; and
    a third routine, associated with said first and second routines, that employs said first and second factors in a total yield function to perform said yield analysis.

18. The system as recited in claim 17 wherein said first factor is based on a defect density of a first component-type and a size of said first component-type area.

19. The system as recited in claim 17 wherein said second factor is based on a defect density of a second component-type and a size of said second component-type area.

20. The system as recited in claim 17 wherein said first factor is exponentially related to a defect density of a first component-type.

21. The system as recited in claim 17 wherein said second factor is exponentially related to a defect density of a second component-type.

22. The system as recited in claim 17 wherein said first component-type is selected from the group consisting of:
   a standard component,
   a memory component, and
   a null component.

23. The system as recited in claim 17 wherein said probability is determined by employing a function selected from the group consisting of:
   a Poisson function,
   a Murphy function, and
   a negative binomial function.

* * * * *